(12) United States Patent
Lee

(10) Patent No.: US 10,932,330 B2
(45) Date of Patent: Feb. 23, 2021

(54) DEVICE TO SUPPORT COOKING CONTAINER FOR SMART UNDER RANGE

(71) Applicants: PEACEWORLD CO., LTD, Seoul (KR); AIRCOOK CO., LTD, Hanam-si (KR)

(72) Inventor: Myung Ok Lee, Hanam-si (KR)

(73) Assignees: PEACEWORLD CO., LTD, Seoul (KR); AIRCOOK CO., LTD, Hanam-si (KR)

( * ) Notice: Subject to any disclaimer, the term of this patent is extended or adjusted under 35 U.S.C. 154(b) by 429 days.

(21) Appl. No.: 15/752,342

(22) PCT Filed: Jun. 24, 2016

(86) PCT No.: PCT/KR2016/006769
§ 371 (c)(1),
(2) Date: Feb. 13, 2018

(87) PCT Pub. No.: WO2017/026646
PCT Pub. Date: Feb. 16, 2017

(65) Prior Publication Data
US 2020/0205240 A1    Jun. 25, 2020

(30) Foreign Application Priority Data
Aug. 13, 2015 (KR) .................. 10-2015-0114921

(51) Int. Cl.
*H05B 6/06* (2006.01)
*H05B 6/12* (2006.01)
(Continued)

(52) U.S. Cl.
CPC ............ *H05B 6/1209* (2013.01); *A47J 36/32* (2013.01); *H05B 6/062* (2013.01); *H05K 9/0022* (2013.01);
(Continued)

(58) Field of Classification Search
CPC .................. H05B 6/062; H05B 2213/07
(Continued)

(56) References Cited

U.S. PATENT DOCUMENTS 3,742,179 A * 6/1973 Harnden, Jr. .......... H05B 6/062
                                                     219/627
6,316,753 B2 * 11/2001 Clothier .................. H05B 6/06
                                                     219/621
(Continued)

FOREIGN PATENT DOCUMENTS

CN    101484785 A    7/2009
CN    201774691 U    3/2011
(Continued)

OTHER PUBLICATIONS

International Search Report dated Oct. 18, 2016, issued in counterpart International Application No. PCT/KR2016/006769 (3 pages, including annex).

(Continued)

*Primary Examiner* — Quang T Van
(74) *Attorney, Agent, or Firm* — Westerman, Hattori, Daniels & Adrian, LLP

(57) ABSTRACT

A device to support a cooking container for a smart under range being installed under a lower surface of a table comprises a body pad, a cooking container supporting part placed on the body pad, a temperature sensing part placed inside the body pad, a transmitting circuit part provided inside the body pad and transferring a temperature sensed by the temperature sensing part to an outside, and a power supply part supplying power to the transmitting circuit part.

8 Claims, 9 Drawing Sheets

(51) Int. Cl.
*A47J 36/32* (2006.01)
*H05K 9/00* (2006.01)

(52) U.S. Cl.
CPC ...... *H05B 2213/05* (2013.01); *H05B 2213/06* (2013.01); *H05B 2213/07* (2013.01)

(58) Field of Classification Search
USPC ....... 219/622, 621, 624, 625, 627, 501, 667, 219/620; 340/870.17, 870.31, 870.39; 374/141; 99/358
See application file for complete search history.

(56) References Cited

U.S. PATENT DOCUMENTS

| | | |
|---|---|---|
| 2007/0263699 A1 | 11/2007 | Clothier et al. |
| 2009/0095736 A1 | 4/2009 | Graber et al. |
| 2015/0163864 A1* | 6/2015 | Baarman ................ H02J 50/12 99/358 |

FOREIGN PATENT DOCUMENTS

| | | |
|---|---|---|
| CN | 202253827 U | 5/2012 |
| CN | 204141633 U | 2/2015 |
| DE | 102010020189 A1 | 1/2011 |
| EP | 1492386 A1 | 12/2004 |
| EP | 2693127 A1 | 2/2014 |
| JP | 63-269488 A | 11/1988 |
| JP | 2006-230516 A | 9/2006 |
| JP | 2008-503050 A | 1/2008 |
| JP | 2009-93804 A | 4/2009 |
| JP | 2013-16497 A | 1/2013 |
| JP | 2013-47675 A | 3/2013 |
| JP | 2013-191300 A | 9/2013 |
| KR | 10-0497905 B1 | 6/2005 |
| KR | 10-0878187 B1 | 1/2009 |
| KR | 10-1400881 B1 | 6/2014 |
| KR | 10-1539957 B1 | 7/2015 |
| WO | 2015/032419 A1 | 3/2015 |

OTHER PUBLICATIONS

Office Action dated Jan. 28, 2019, issued in counterpart CN Application No. 201680060263.9, with English translation (16 pages).
Office Action dated Jan. 29, 2019, issued in counterpart to JP Application No. 2018-527700, with English translation (5 pages).
Decision to Grant a Patent dated Sep. 3, 2019, issued in counterpart JP Application No. 2018-527700, with English translation (3 pages).
Extended (supplementary) European Search Report dated Mar. 14, 2019, issued in counterpart EP Application No. 16835288.8. (5 pages).

* cited by examiner

DEVICE TO SUPPORT COOKING CONTAINER FOR SMART UNDER RANGE

CROSS-REFERENCE TO RELATED APPLICATION

This application claims priority to Korean Patent Application No. 10-2015-0114921, filed Aug. 13, 2015, the contents of which are incorporated herein by reference in its entirety.

TECHNICAL FIELD

The present invention relates to a device to support a cooking container for a smart under range. More specifically, the present invention relates to a device to support a cooking container for a smart under range, which supports on a table the cooking container heated by a smart under range capable of heating an object by stronger magnetic fields than an induction range providing heat by a magnetic field induction even though the smart under range is installed under the table for cooking food.

BACKGROUND

Generally, an induction range is a device where eddy currents are created by a resistance component, such as iron, included in the material of a cooking container when magnetic lines of force generated in a coil pass through the bottom of the cooking container placed on the top plate of the range, and the eddy currents heat up only the cooking container for cooking.

That is, since the eddy currents, locally flowing through a closed path inside a conductor in a swirling shape, are generated due to change in magnetic flux passing through the conductor, the cooking container must include conductive material to be used for the induction range.

An example of such induction range is disclosed in Korean Patent No. 10-1400881, patented on May 22, 2014, hereinafter referred to as Patent Document 1.

Because the range on which the magnetic field exerts influence in the induction range are comparatively small, the cooking container is placed directly on the upper surface of the induction range, in general. In this instance, if food overflows from the cooking container during cooking, the food sticks to the induction range and the induction range may be contaminated or damaged. Also, installation of the induction range and the placement of the cooking container can be limited. Due to these problems, a smart under range has been recently introduced, which can be installed under a table by increasing influence of the magnetic field by stronger electromotive force.

Meanwhile, in an induction range or a smart under range, it is very important to detect temperatures of the cooking container heated up by induction. For example, if the cooking container is continuously heated up by induction without temperature sensing, water inside the cooking container all boils away and evaporates. Further, the cooking container is overheated, which may cause fire. Thus, it is common to control the induction to stop operating by temperature sensing if the temperature of the cooking container reaches 130° C.

However, if the conventional induction range is modified for use in the smart under range, the means for sensing the temperature of the cooking container heated up by induction should be separately installed after piercing the table. Hence, installation of the sensing means can be difficult and operation control of the smart under range induction may be troublesome.

Moreover, if the means for sensing temperature is arranged only at the smart under range induction installed under the table without being arranged to directly sense the temperature of the cooking container, the temperature of the cooking container cannot be precisely detected due to difference from the actual temperature of the cooking container. Also, the operation control of the smart under range induction may not be precisely performed.

SUMMARY OF THE INVENTION

Technical Problems

An object of the present invention is to provide a device to support a cooking container for a smart under range, capable of facilitating operation control of the smart under range induction and simplifying installation of a means for sensing temperatures of the cooking container heated up by the smart under range induction.

In addition, another object of the present invention is to provide a device to support a cooking container for a smart under range, capable of directly sensing the temperature of the cooking container and precisely performing operation control of the smart under range induction based on precise temperature sensing.

Technical Solutions

In order to achieve the above object, the present invention may be implemented by embodiments having the following features.

According to the present invention, a device to support a cooking container for a smart under range comprises: a body pad placed on the upper surface of a table in which a smart under range induction is installed and having an upper part on which a cooking container heated by means of the smart under range is placed; a cooking container supporting part provided on the upper surface of a floor part of the body pad; a temperature sensing part interposed between the upper surface of the floor part of the body pad to directly sense the temperature of the cooking container; a transmitting circuit part provided inside the body pad and connected to the temperature sensing part for transmitting the result sensed by the temperature sensing part to the outside; and a power supply part provided inside the body pad for supplying power to the transmitting circuit part.

Preferably, the body pad is formed by insulating material, the cooking container supporting part is formed by glass-ceramic, and the transmitting circuit part is protected inside the body pad by a magnetic field shielding means.

Preferably, the device to support a cooking container for a smart under range according to the present invention includes a main controller communicating with the transmitting circuit part and controlling the smart under range induction based on the result sensed by the temperature sensing part.

Preferably, the device to support a cooking container for a smart under range according to the present invention comprises a remote controller communicating with the main controller and outputting the result sensed by the temperature sensing part, wherein setting signals according to which the main controller sets controlling conditions for the smart under range induction can be remotely input by the remote controller.

Preferably, the transmitting circuit part includes an RF module.

Technical Effects

According to the present invention, provided is a device to support a cooking container for a smart under range, capable of facilitating operation control of the smart under range induction and simplifying installation of a means for sensing temperatures of the cooking container heated up by the smart under range induction.

Also, provided is a device to support a cooking container for a smart under range, capable of directly sensing temperatures of the cooking container and precisely performing operation control of the smart under range induction based on precise temperature sensing.

DETAILED DESCRIPTION

Figure 1:
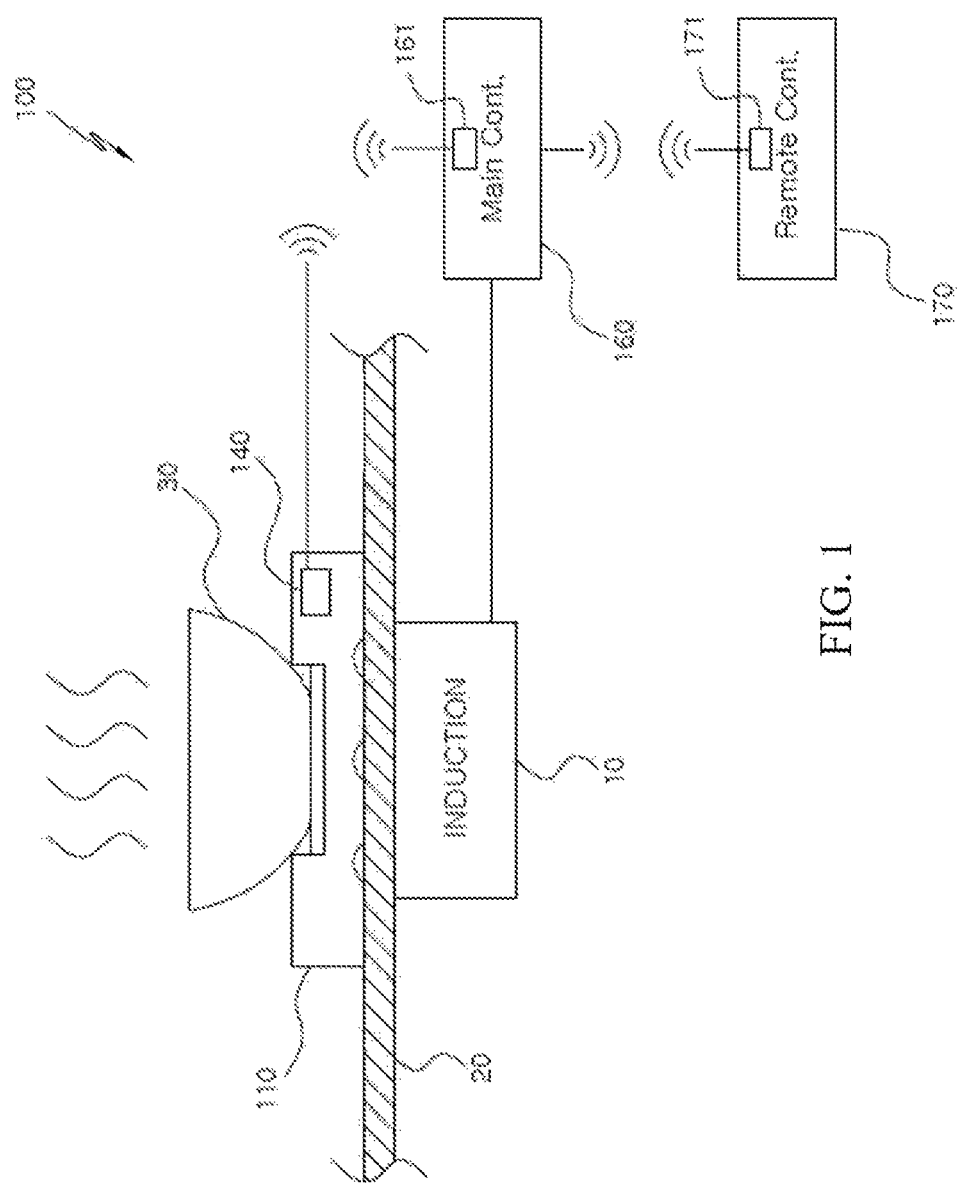
FIG. 1 is a schematic view for schematically illustrating a device to support a cooking container for a smart under range according to the present invention.

Hereinafter, embodiments of the present invention will be described in detail with reference to accompanying drawings.

As shown in FIGS. 1 to 4, a device 100 to support a cooking container for a smart under range according to the present invention comprises: a body pad 110 placed on the upper surface of a table 20 in which a smart under range induction 10 is installed and having an upper part on which a cooking container 30 heated by means of the smart under range induction 10 is placed; a cooking container supporting part 120 provided on the upper surface of a floor part 111 of the body pad 110; a temperature sensing part 130 interposed between the upper surface of the floor part 111 of the body pad 110 and the cooking container supporting part 120 for directly sensing the temperature of the cooking container 30; a transmitting circuit part 140 placed inside the body pad 110 and connected to the temperature sensing part 130 for transmitting the result sensed by the temperature sensing part 130 to the outside; and a power supply part 150 provided inside the body pad 110 for supplying power to the transmitting circuit part 140.

Accordingly, as shown in FIG. 1, the temperature of the cooking container 30 heated by the smart under range induction 10 is directly sensed at the upper part of the table 20 under which the smart under range induction 10 is installed such that the temperature sensing part 130 designed to help safe heating of the cooking container 30 is easily and simply installed.

As shown in FIGS. 2 to 5, the body pad 110 is formed by insulating material, such as wood and resin including plastic. The floor part 111 coupled to the cooking container supporting part 120 is formed in a part concavely depressed from the upper surface of the body pad 110, and a plurality of heat discharge grooves 113 are recessively formed in the lower part of the body pad 110 side by side in a longitudinal direction.

Thus, even though strong magnetic field created by the smart under range induction 10 is transferred to the body pad 110, the body pad 110 can avoid being heated up by thermal resistance. Also, the cooking container 30 is stably received by the cooking container supporting part 120 such that the cooking container 30 is supported by the body pad 110. Moreover, heat produced during heating of the cooking container 30 can be discharged to the outside through the heat discharge grooves 113.

Figure 2:
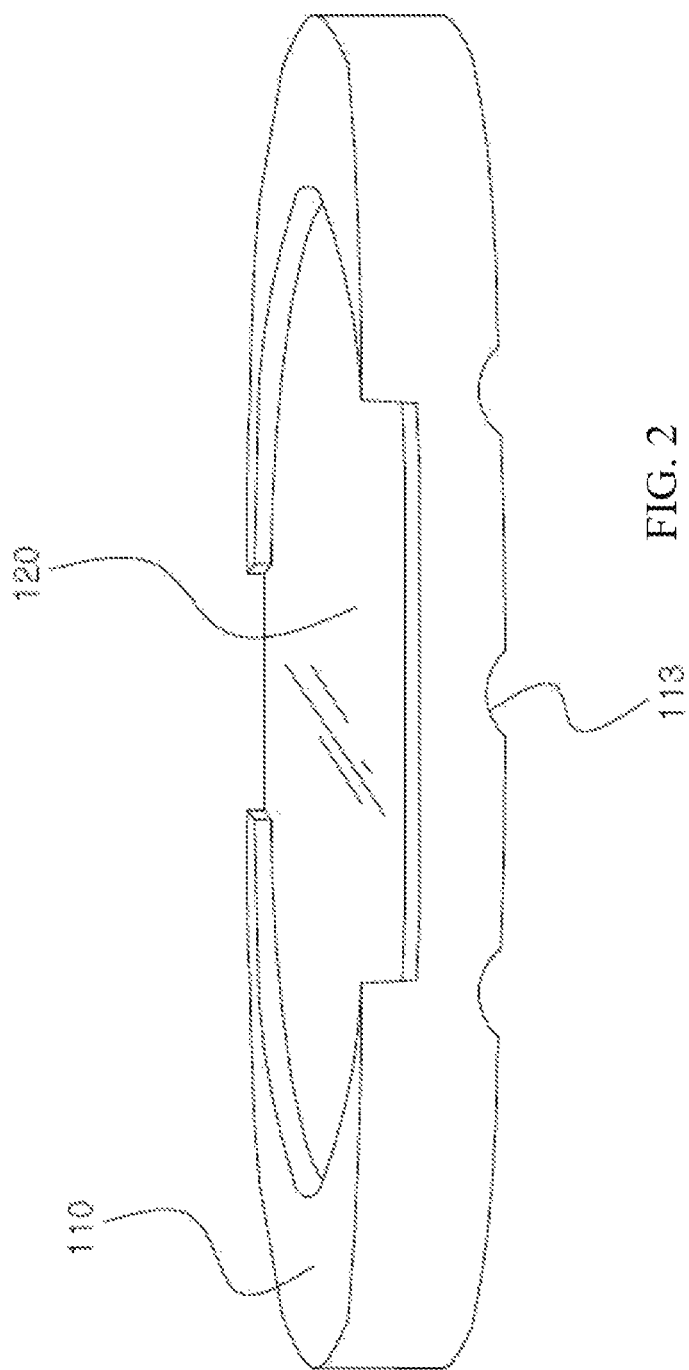
FIG. 2 is a perspective view illustrating a body pad of FIG. 1 and a cooking container supporting part in a coupled state.
Figure 3:
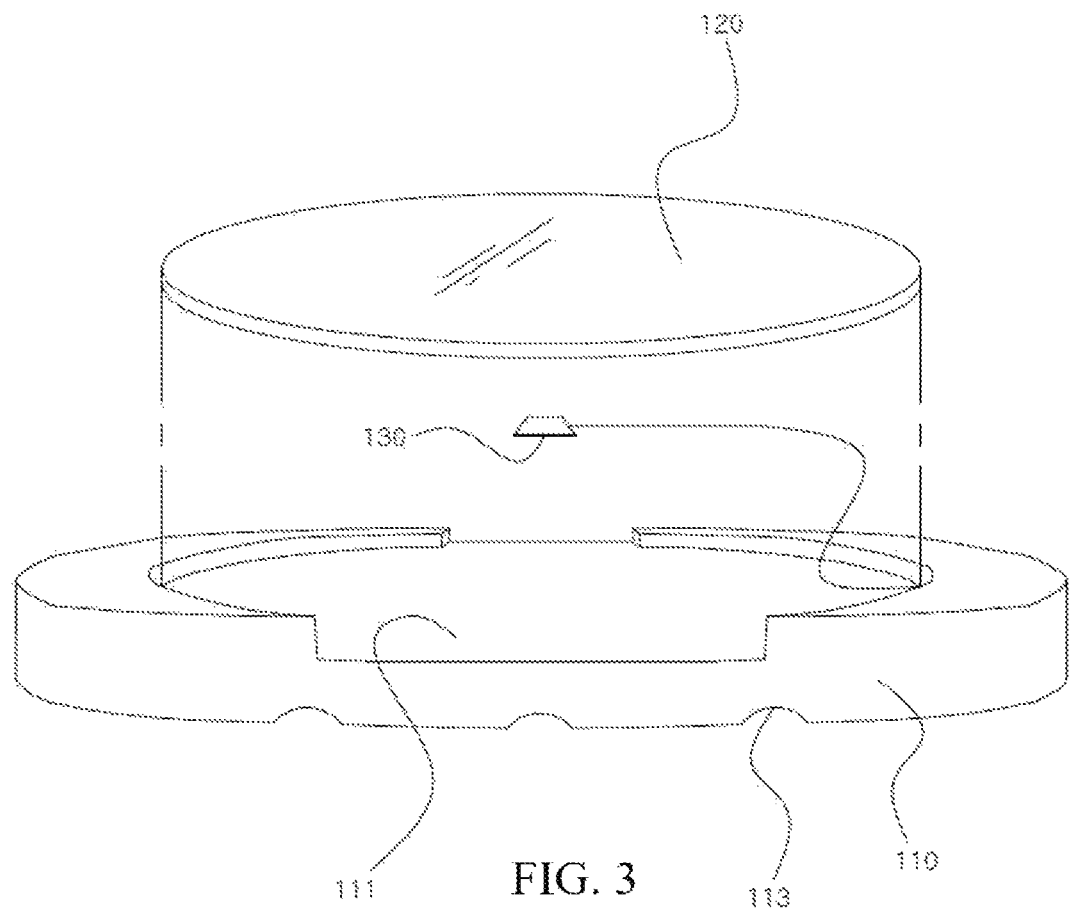
FIG. 3 is an exploded perspective view illustrating the body pad and the cooking container supporting part of FIG. 2.

As shown in FIGS. 2 and 3, the cooking container supporting part 120 is made by glass-ceramic material and formed to have a substantially circular shape and comparatively small thickness.

Accordingly, heat resisting property prevents the cooking container 30 from being set on fire or damaged during heating of the cooking container 30 while only the cooking container 30 is heated.

Figure 4:
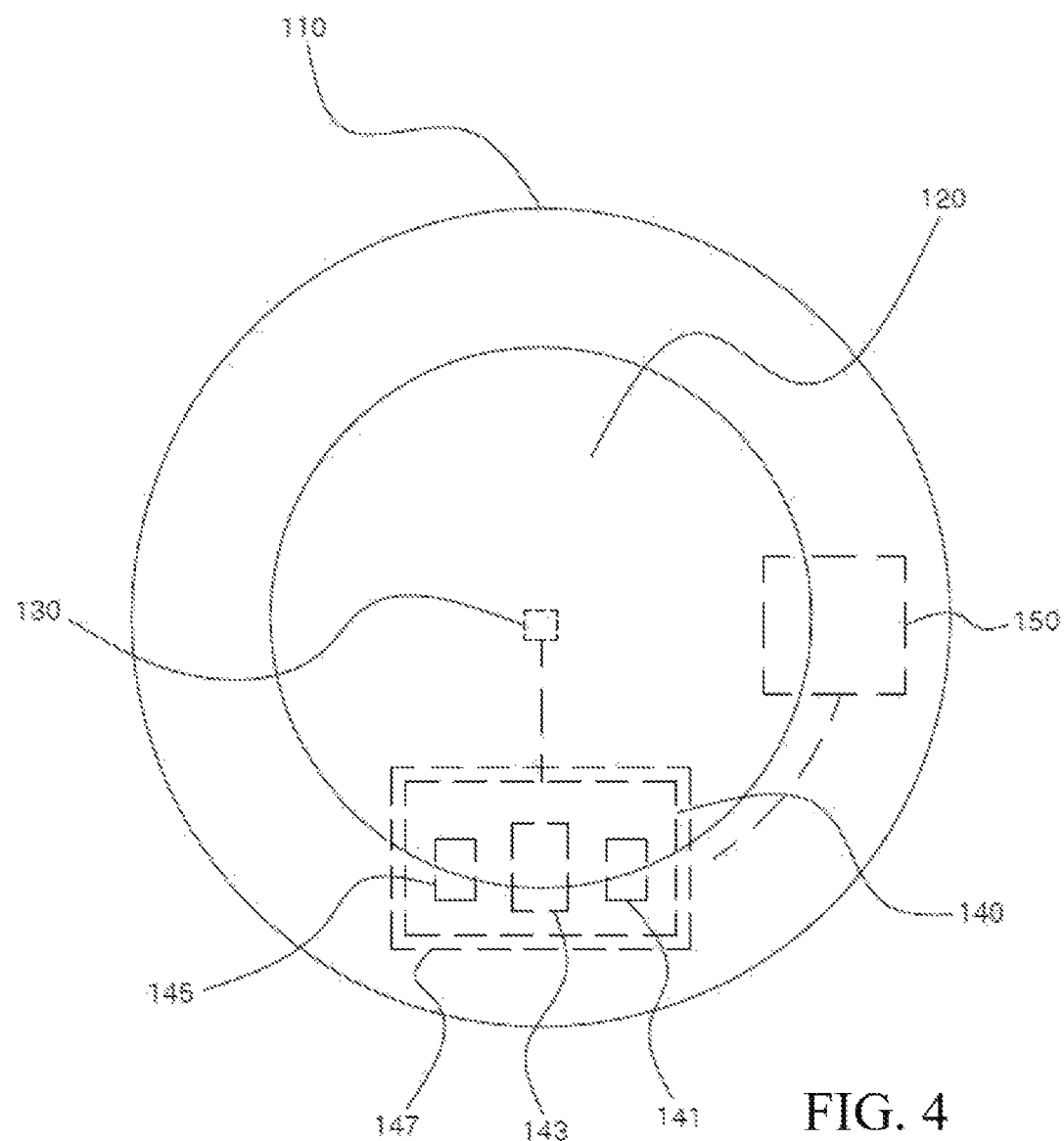
FIG. 4 is a plan view of the body pad of FIG. 2 as viewed from top.
Figure 5:
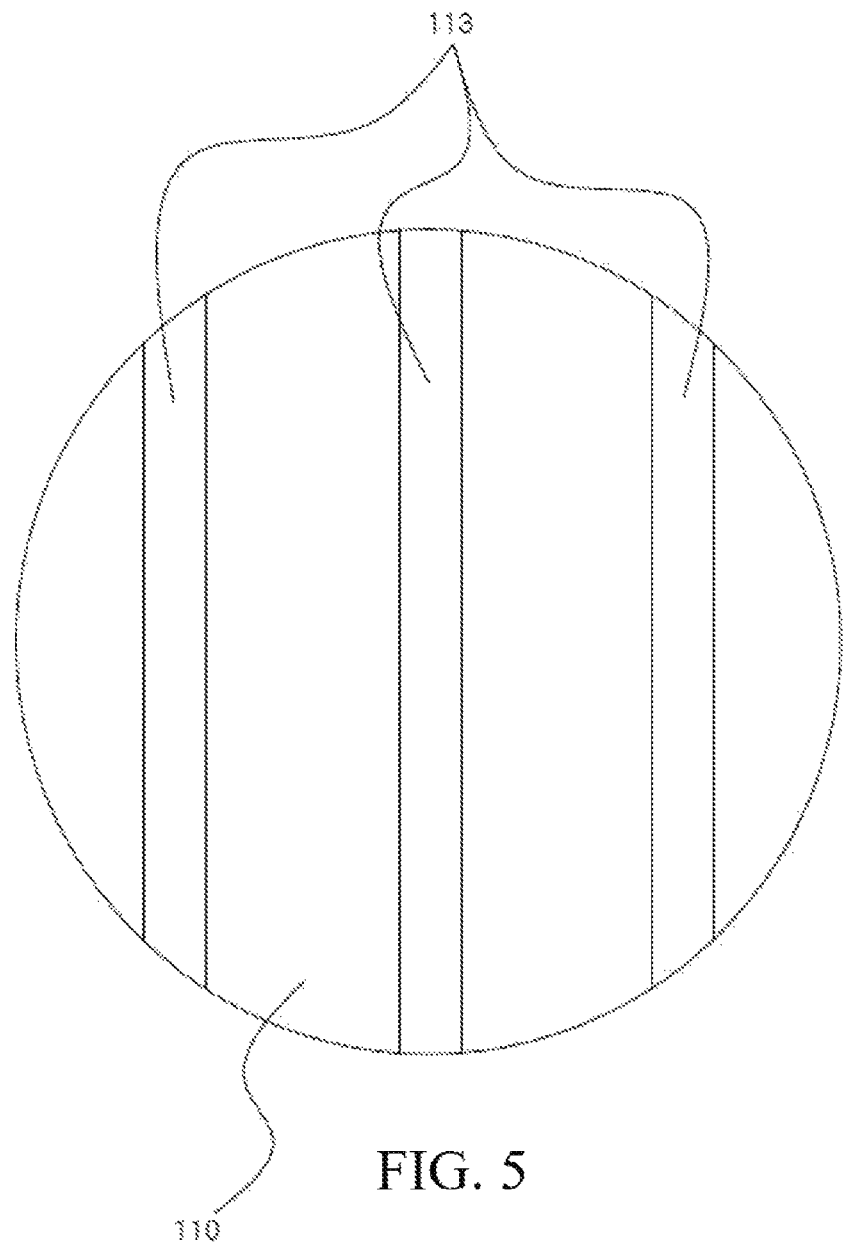
FIG. 5 is a bottom view of the body pad of FIG. 2 as viewed from bottom.

As shown in FIGS. 3 and 4, the temperature sensing part 130 includes a thermistor. The temperature sensing part 130 is disposed in a center part of the lower surface of the cooking container supporting part 120. The temperature sensing part 130 is disposed between the cooking container supporting part 120 and the body pad 110 to be electrically connected to the transmitting circuit part 140.

Conventionally, the temperature sensing part 130 is installed at the side of the smart under range induction 10 mounted under the table 20. However, the temperature sensing part 130 according to the present invention is installed to directly sense the temperature of the cooking container 30 at the upper part of the table 20. Accordingly, the operation control of the smart under range induction 10 is more accurately performed by the improved sensing of the temperature such that heating of the cooking container 30 is safely performed.

Preferably, the temperature sensing part 130 according to the present invention senses the temperature at a certain time interval, e.g., 0.5 second or 1 second, after the temperature reaches an operating setting temperature, e.g., 60° C.

As a result, electricity consumption resulting from the temperature sensing part 130 continuously sensing the temperature can be reduced.

The transmitting circuit part 140, as shown in FIG. 4, includes a body radio frequency (RF) module 141. The body RF module 141 is an RF communication module enabling data transmission at a remote site without wires by using wireless high frequency. Although its speed may be slower than that of Bluetooth, the RF module is capable of continuously transmitting data and more suitable especially in a circumstance where data size is comparatively small as in the present invention.

The temperature is sensed by the temperature sensing part 130 installed inside the body pad 110 and sensing the temperature of the cooking container 30 at the upper part of the table 20. Then the sensed temperature can be transferred to a main controller 160 controlling the smart under range induction 10, as described below, by the RF wireless communication method.

As shown in FIG. 1, the body RF module 141 of the transmitting circuit part 140 is configured to send out and receive data only with a main RF module of the main controller 160, recognized by a distinct identification number, not with any RF module present around.

According to the present invention, the transmitting circuit part 140, as shown in FIG. 4, receives the temperature sensed by the temperature sensing part 130 at a certain time interval, e.g., 0.5 second or 1 second, from the time when the temperature sensed by the temperature sensing part 130 reaches an operating setting temperature, e.g., 60° C., and transmits the received temperature to the outside. To achieve this end, the transmitting circuit part 140 includes a microcomputer 143 configured in the form of a PCB circuit inside. Also, it is preferable to protect the transmitting circuit part 140 by a magnetic field shielding means 147, such as an aluminum casing, inside the body pad 110.

Accordingly, malfunctioning of the transmitting circuit part 140 due to the influence of the magnetic field can be prevented by the magnetic field shielding means 147.

A location sensing part 145 is provided in the transmitting circuit part 140. The location sensing part 145 senses whether the body pad 110 is properly positioned on the upper surface of the table 20 under which the smart under range induction 10 is installed to ensure that the cooking container 30 is in the right position for heating.

According to the present invention, the location sensing part 145 is disposed near the lower part in the body pad 110 and preferably includes a foil sensor utilizing voltage drop generated based on change in distance from an electrical resistor.

Then the transmitting circuit part 140 starts to operate when the body pad 110 is placed in the right position on the upper surface of the table 20 and wirelessly communicate with the main controller 160. Accordingly, consumption of electricity supplied from the power supply part 150 can be reduced. Also, if the microcomputer 143 determines with the aid of the location sensing part 145 that the body pad 110 is not in the right position even though being placed on the upper surface of the table 20, an alarm can be set to go off by control such that the user can readily notice the status.

The power supply part 150 may comprise a battery or a mercury battery detachably provided inside the body pad 110 or may comprise a solar battery using sunlight.

As shown in FIG. 1, the device 100 to support the cooking container for a smart under range may preferably further comprise a main controller 160 which communicates with the transmitting circuit part 140 and controls the smart under range induction 10 based on a result sensed by the temperature sensing part 130.

As shown in FIG. 1, the main controller 160 comprises a main RF module 161 to communicate with the transmitting circuit part 140 and communicates with the transmitting circuit part 140 in real time. Also, the main controller 160 includes a power ON/OFF module configured to stop the operation of the smart under range induction 10 if the temperature sensed by the temperature sensing part 130 is determined to reach an OFF-setting temperature, e.g., 130° C.

The main controller 160 communicates in real time with the transmitting circuit part 140 provided inside the body pad 110 by the RF wireless communication method and the operation of the smart under range induction 10 can be precisely and easily controlled in accordance with the temperature of the cooking container 30, directly sensed and provided by the temperature sensing part 130.

In addition, as shown in FIG. 1, the device 100 to support the cooking container for a smart under range may further comprise a remote controller 170. The remote controller 170 sends and receives a signal to and from the main controller 160. The result sensed by the temperature sensing part 130 is displayed on the remote controller 170. Setting signals, such as the OFF-setting temperature, etc., according to which the main controller 160 sets controlling conditions for the smart under range induction 10, can be input remotely to the main controller 160 through the remote controller 170.

The main controller 160 conveys real time data including the temperature of the cooking container 30 sensed by the temperature sensing part 130 to the remote controller 170 by the RF wireless communication method.

The remote controller 170, as shown in FIG. 1, comprises a remote RF module 171 to communicate with the main controller 160 and includes a display part on which the measurements sensed by the temperature sensing part 130 is visually output. The remote controller 170 controls the main controller 160 to control the operation of the smart under range induction 10 or includes a power ON/OFF switch module which directly controls ON and OFF of the smart under range induction 10.

Accordingly, the user does not need to directly control the main controller 160 but is able to control the main controller 160 or the smart under range induction 10 at a distance from the main controller 160. Hence, the main controller 160 may be installed at any location, like as a built-in type. Also, in case the main controller 160 malfunctions, control can be continuously maintained, thereby facilitating the operation control of the smart under range induction 10.

Figure 6:
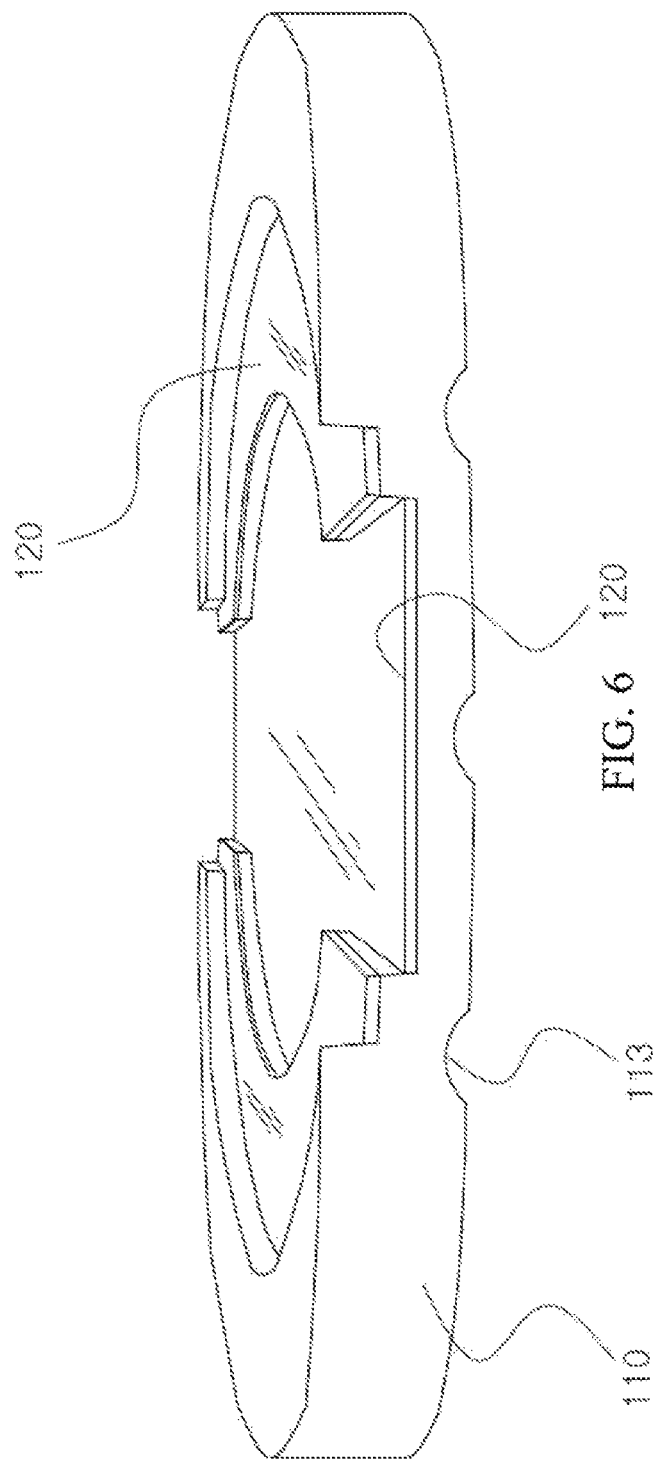
FIG. 6 is a perspective view of a body pad according to another embodiment of the present invention.

According to another embodiment, as shown in FIG. 6, the upper part of the body pad 110 is concavely formed in a step type and the floor part 111 coupled to the cooking container supporting part 120 is also arranged to gradually expand toward the upper part in a step type.

Accordingly, even though the size of the cooking container 30 changes, different sizes of the body pad 10 do not need to be used. That is, one body pad 110 can support the cooking container 30 with various sizes.

Figure 7:
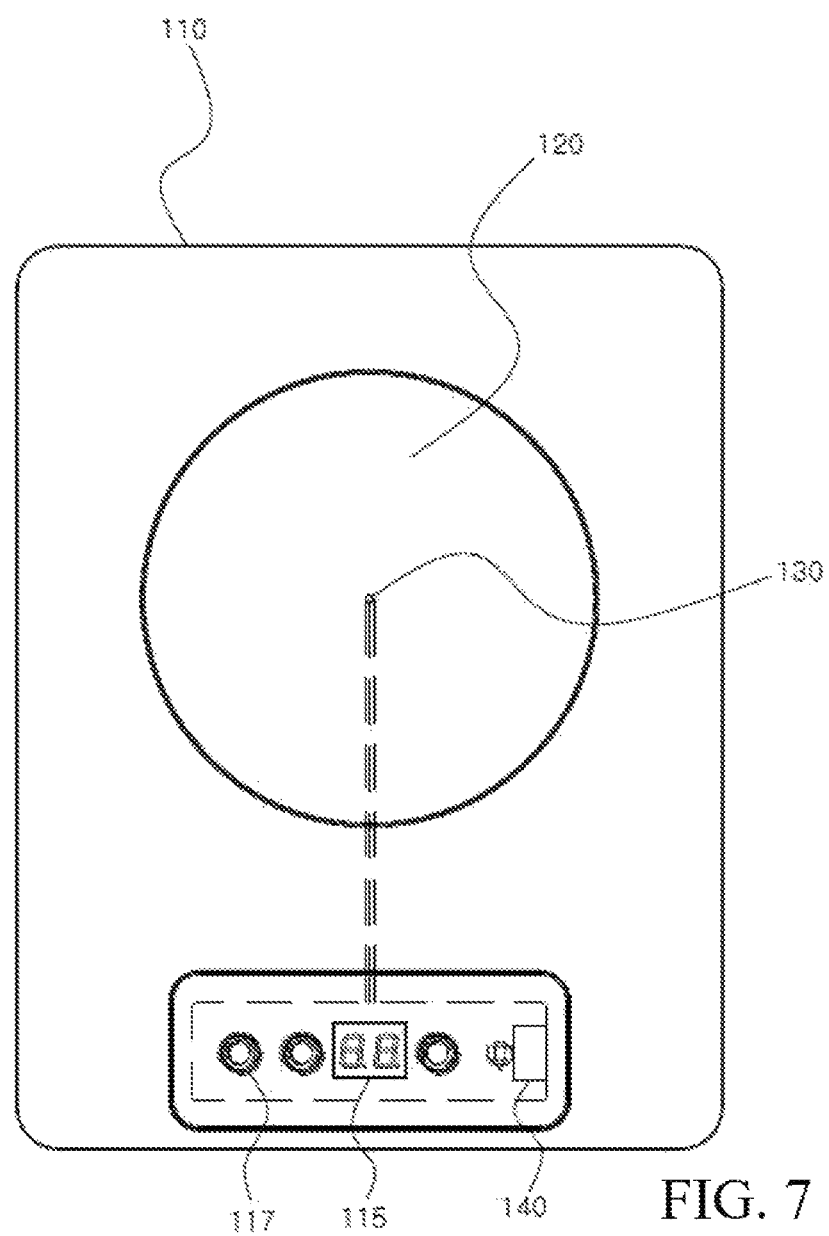
FIG. 7 is a plan view of a body pad according to another embodiment of the present invention.
Figure 8:
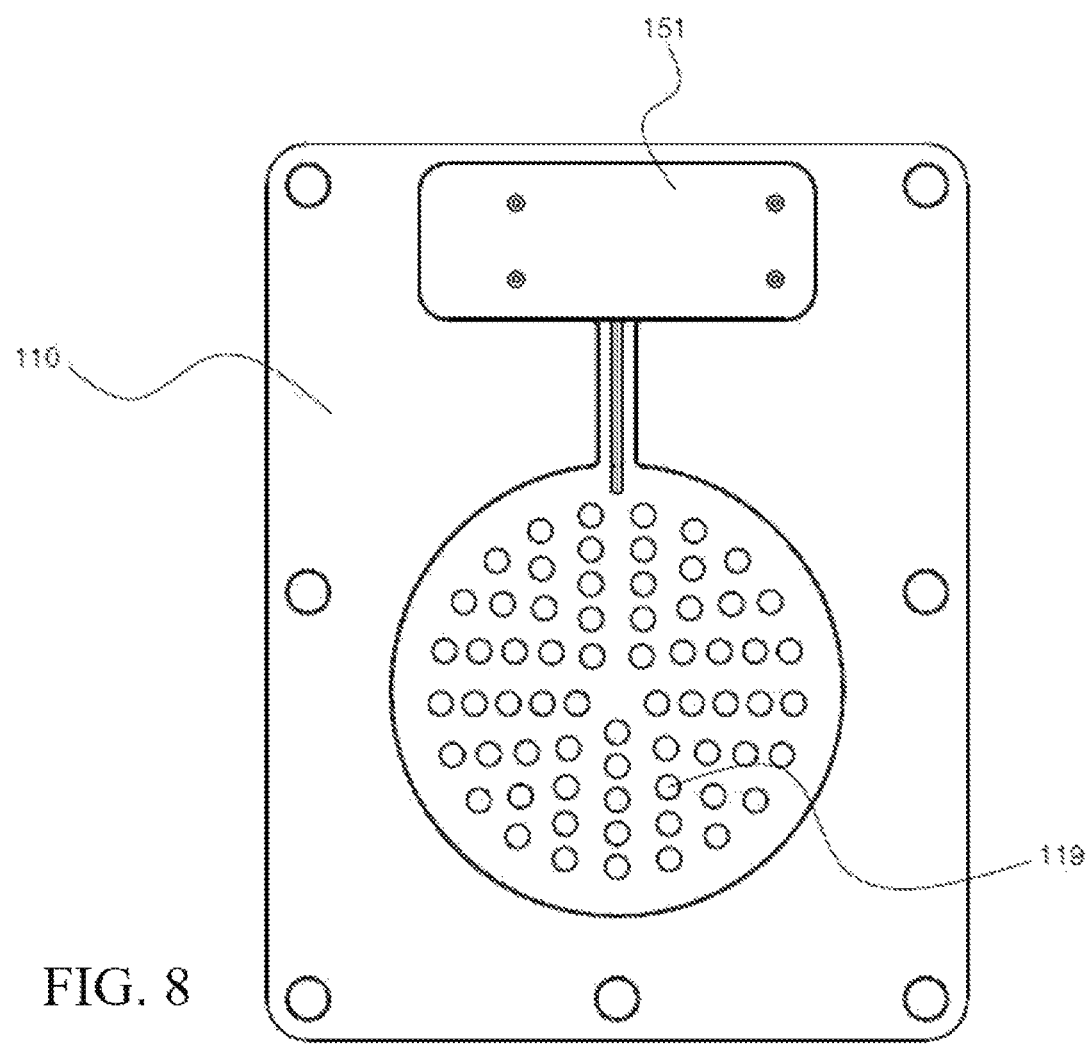
FIG. 8 is a bottom view of the body pad of FIG. 7.
Figure 9:
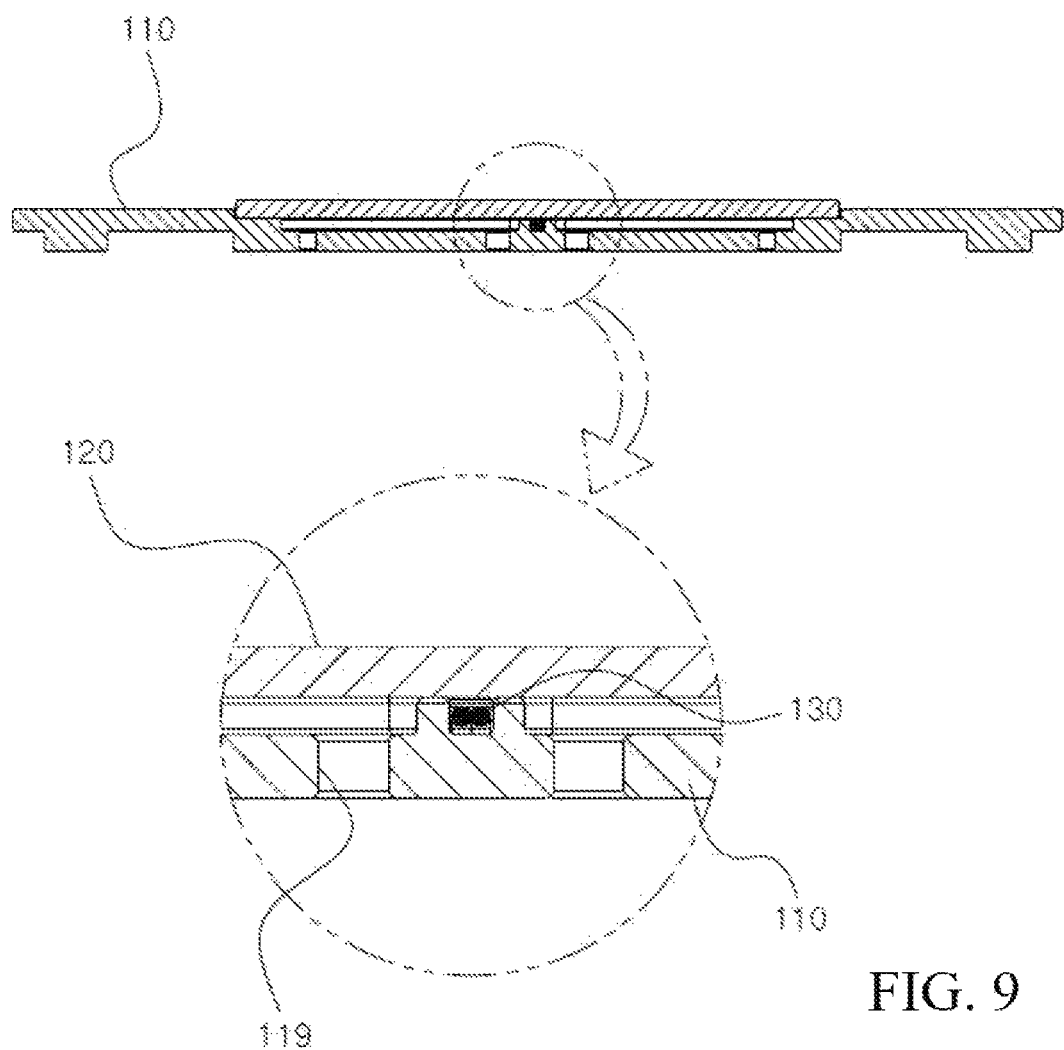
FIG. 9 is a side cross-sectional view of the body pad of FIG. 7.

According to another embodiment of the present invention, as shown in FIGS. 7 to 9, the body pad 110 may be formed to have a substantially rectangular shape and a small thickness.

The body pad 110, as shown in FIG. 7, includes a temperature display part 115 on its upper surface, on which the temperature sensed by the temperature sensing part 130 is displayed by an LED element in real time. Also, an input part 117 may be further provided on the upper surface. An input signal by the user is directly input by the input part 117 such that the main controller 160 or the smart under range induction 10 is controlled even without using the remote controller 170.

As shown in FIGS. 8 and 9, a plurality of heat discharge holes 119 penetrating to the inside are formed in the lower surface of the body pad 110, and, in this case, it is preferable that the power supply part 150 includes a mercury battery or a solar battery having a small thickness, which is inserted into the body pad 110 by opening and closing a battery cover 151.

The operating procedures for the device 100 to support a cooking container for a smart under range according to the present invention based on the elements described above are now described.

First, the user turns on the power of the smart under range induction 10 by manipulating the remote controller 170 or directly manipulating the main controller 160.

Then the cooking container 30 is gradually heated up by induction heating as the smart under range induction 10 operates. The temperature sensing part 130 provided in the lower surface of the cooking container supporting part 120 starts to sense in real time the heating temperature of the cooking container 30 at a certain time interval, e.g., 0.5 second or 1 second, from the time when the heating temperature reaches the operating setting temperature, e.g., 60° C.

The temperature of the cooking container 30 detected by the temperature sensing part 130 is transmitted to the main controller 160 through the transmitting circuit part 140. If the main controller 160 determines that the temperature sensed by the temperature sensing part 130 reaches the OFF setting temperature, e.g., 130° C., the main controller 160 turns off the smart under range induction 10 such that the smart under range 10 stops to operate or informs the user of the temperature by conveying the status to the remote controller 170.

Although the technical aspect was described in the description above and accompanying drawings, the technical spirit of the present invention is designed for the description and not limited thereto. A person having ordinary skill in the art will understand that the present invention may be modified and given to various changes within the scope of the technical ranges described in the appended claims.

INDUSTRIAL APPLICABILITY

According to the present invention, provided is a device to support a cooking container for a smart under range induction, capable of simplifying the installation of the means for sensing the temperature of the cooking container heated by the smart under range induction and facilitating the operation control of the smart under range induction, thereby having industrial applicability.

The invention claimed is:

1. A device to support a cooking container for a smart under range being installed under a lower surface of a table, comprising:
   a body pad placed on an upper surface of the table under which a smart under range induction is installed, having an upper part on which a cooking container heated by means of the smart under range is placed and provided with a floor part concavely depressed from the upper part;
   a cooking container supporting part provided on an upper surface of the floor part of the body pad;
   a temperature sensing part interposed between the upper surface of the floor part of the body pad and the cooking container supporting part and disposed below a center part of the cooking container supporting part to directly sense a temperature of the cooking container;
   a transmitting circuit part provided inside the body pad and connected to the temperature sensing part for transmitting a result sensed by the temperature sensing part to an outside; and
   a power supply part provided inside the body pad for supplying power to the transmitting circuit part,
   wherein the body pad is formed by insulating material,
   the cooking container supporting part is formed by glass-ceramic,
   the transmitting circuit part includes a microcomputer configured inside in the form of a PCB circuit and receiving and sending out the temperature sensed at a certain time interval by the temperature sensing part from the time when the temperature sensed by the temperature sensing part reaches an operating setting temperature, the transmitting circuit part being protected inside the body pad by a magnetic field shielding means, and
   the transmitting circuit part includes a location sensing part sensing whether the cooking container placed on the body pad is in a right position for heating at the upper surface of the table under which the smart under range induction is installed and conveying a sensing result to the microcomputer,
   wherein the transmitting circuit part starts to operate when the location sensing part determines that the body pad is placed in the right position for heating, and
   an alarm goes off if the location sensing part determines that the body pad is not placed in the right position for heating.

2. The device of claim 1, wherein a plurality of heat discharge grooves are recessively formed in a lower part of the body pad.

3. The device of claim 1, further comprising a main controller communicating with the transmitting circuit part and controlling the smart under range induction based on the result sensed by the temperature sensing part.

4. The device of claim 3, further comprising a remote controller communicating with the main controller and outputting the result sensed by the temperature sensing part, wherein setting signals according to which the main controller sets controlling conditions for the smart under range induction are remotely input by the remote controller.

5. The device of claim 1, wherein the transmitting circuit part comprises an RF module.

6. The device of claim 2, wherein the transmitting circuit part comprises an RF module.

7. The device of claim 3, wherein the transmitting circuit part comprises an RF module.

8. The device of claim 4, wherein the transmitting circuit part comprises an RF module.

* * * * *